United States Patent [19]

Micheli et al.

[11] Patent Number: 4,962,088

[45] Date of Patent: * Oct. 9, 1990

[54] FORMATION OF FILM SUPERCONDUCTORS BY METALLO-ORGANIC DEPOSITION

[75] Inventors: Adolph L. Micheli; Dennis F. Dungan, both of Mt. Clemens; Aboud H. Hamdi, Detroit; Joseph V. Mantese, Washington; Ruth Carol O. Laugal, Union Lake, all of Mich.

[73] Assignee: General Motors Corporation, Detroit, Mich.

[*] Notice: The portion of the term of this patent subsequent to Apr. 17, 2007 has been disclaimed.

[21] Appl. No.: 186,627

[22] Filed: Apr. 27, 1988

Related U.S. Application Data

[63] Continuation-in-part of Ser. No. 136,270, Dec. 22, 1987, abandoned, which is a continuation-in-part of Ser. No. 103,245, Sep. 30, 1987, abandoned.

[51] Int. Cl.$^5$ .............................................. B05D 5/12
[52] U.S. Cl. ...................................... 505/1; 505/734; 505/742; 427/62; 427/126.3; 427/226
[58] Field of Search ................ 427/62, 63, 126.3, 226; 505/1, 818, 819, 734, 742

[56] References Cited

U.S. PATENT DOCUMENTS

| | | | |
|---|---|---|---|
| 4,239,816 | 12/1980 | Breininger et al. | 427/168 |
| 4,292,347 | 9/1981 | Donley | 427/110 |
| 4,485,094 | 11/1984 | Pebler et al. | 427/126.3 |

OTHER PUBLICATIONS

M. E. Gross et al., "Versatile New Metalorganic Process for Preparing Superconducting thin Films", *Applied Physics Letters*, vol. 52, No. 2, Jan. 11, 1988, pp. 160-162.

C. E. Rice et al.; "Preparation of Superconducting Thin Films of $Ba_2YCu_3O_7$ by a Novel Spin-On Pyrolysis Technique", *Applied Physics Letters*, vol. 51, No. 22, Nov. 30, 1987, pp. 1842-1844.

D. K. Lathrop et al., "Production of $YBa_2Cu_3O_{7-y}$ Superconducting Thin Films in situ by High Pressure Reactive Evaporation and Rapid Thermal Annealing", *Applied Physics Letters*, vol. 51, No. 19, Nov. 9, 1987, pp. 1554-1556.

Hammond et al. "Superconducting Thin Films of the Pemvskite Superconductors by Electron-beam Deposition", MRS(Anaheim, Ca.)Apr., 1987, pp. 169-171.

Vest et al. "Synthesis of Metallo-Organic Compounds for MOD Powders and Films", MRS(Boston) Dec. 1985, P1-10.

Meng et al., "High Tc Superconducting Thin Films by Chemical Spray Deposition", Int. Jour. of Modern. Phys. B. vol. 1, No. 2, Jul. 1987, pp. 579-582.

Ohkuma et al., "Preparation of Y—Ba—Cu—O Thin Films by Rf-Magnetron Sputtering", Jpn. J. Appl. Phys. 26(19), Sep. 1987, L1484-1486.

M. K. Wu et al., "Superconductivity at 93 K in a New Mixed-Phase Y—Ba—Cu—O Compound System at Ambient Pressure", *Physical Review Letters*, vol. 58, No. 9, Mar. 2, 1987, pp. 908-910.

H. Adachi et al., "Preparation and Characterization of Superconducting Y—Ba—Cu—O Thin Film", *Japanese Journal of applied Physics*, vol. 26, No. 5, May 1987, pp. L709-L710.

D. Dijkkamp and T. Venkatesan, "Preparatin of Y—Ba—Cu Oxide Superconductor Thin Films Using Pulsed Laser Evaporation from High $T_c$ Bulk Material", *Applied Physics Letters*, vol. 51, No. 8, Aug. 24, 1987, pp. 619-621.

Bednorz, et al., "Possible High Tc Superconductivity in the Ba—La—Cu—O System", Condensed Matter 64(Z. Phys. B) pp. 189-193 (1986).

Gurvitch et al. "Preparation and Substrate Reactions of Superconducting Y—Ba—Cu—O Films", Appl. Phys. Lett. 51(13)Sep. 1987, p. 1027.

Rao, et al., "Superconductivity Studies on the High Tc Phases in the Yttrium Barium Copper Oxide System", Jpn. J. Appl. Phys. Part 1, 26(Suppl. 26-3, Proc. Int. Conf. Low Temp. Phys., 18th, 1987, Pt. 2) pp. 1077-1078.

*Primary Examiner*—Norman Morgenstern
*Assistant Examiner*—Roy V. King
*Attorney, Agent, or Firm*—Domenica N. S. Hartman

[57] ABSTRACT

A superconducting $Y_1Ba_2Cu_4O_2$ thin film is formed by a metalorganic deposition method which comprises depositing a solution comprising neodecanoates of Y, Ba and Cu and a solvent having at least approximately 5 volume percent pyridine in xylene onto a substrate selected from the group consisting of strontium titanate, barium titanate, and sapphire; pyrolyzing the coated substrate to thermally decompose the neodecanoates at a temperature of about 500° C. followed by a rapid thermal annealing.

2 Claims, No Drawings

FORMATION OF FILM SUPERCONDUCTORS BY METALLO-ORGANIC DEPOSITION

This application is a continuation-in-part of U.S. Ser. No. 136,270, filed in the U.S. on Dec. 22, 1987, which was a continuation-in-part of U.S. Ser. No. 103,245, filed in the U.S. on Sept. 30, 1987, both prior applications entitled, "Formation of Film Superconductors by Metallo-Organic Deposition", now abandoned.

This application is related to the co-pending U.S. patent applications entitled, "Metalorganic Deposition of Superconducting Yb—Ba—Cu—O Thin Films by Rapid Thermal Annealing", U.S. Ser. No. 136,585 and "Metalorganic Deposition of Superconducting Eu—Ba—Cu—O films by Rapid Thermal Annealing", U.S. Ser. No. 136,577, both filed in the U.S. on Dec. 22, 1987.

This invention relates to superconductive materials and methods for making films of superconductive materials.

BACKGROUND OF THE INVENTION

A wide variety of superconductive materials having high transition temperatures have been reported, including superconducting materials comprising yttrium, barium, and copper. The discovery of these and other compounds which are characterized by superconductive properties above the liquid nitrogen temperature, has prompted intensive efforts aimed at the development of thin films from these materials. Thin film superconductors based upon these yttrium, barium, and copper compounds have been prepared by electron-beam and sputter deposition, laser ablation of the material from bulk samples, and multi-layer depositions of the constituent elements followed by annealing. These are all processes which require vacuum processing.

As new materials with ever increasing superconductive transition temperatures are sought and developed, it is desirable to have a means for preparing thin films of these superconducting materials which utilizes non-vacuum techniques, permits easy alteration of chemical components, and is compatible with other film processing techniques.

SUMMARY OF THE INVENTION

It is an object of the present invention to provide superconductive films of material, in particular superconductive films characterized by superconducting transition temperatures greater than the liquid nitrogen temperature.

It is a further object of this invention to provide a method for forming films of superconductive materials.

It is still a further object of this invention that these superconductive films be formed in a non-vacuum, oxygen-containing environment.

In accordance with a preferred embodiment of this invention, these and other objects and advantages are accomplished as follows.

We have prepared for the first time thin film superconductors in a non-vacuum, oxygen-containing environment using Metallo-Organic Deposition (MOD) techniques. Metallo-organic deposition is an entirely nonvacuum method of film deposition. A liquid solution of metallo-organic compounds is prepared by dissolution of the metallo-organic compounds in a suitable solvent. This solution is then applied much in the same manner as photo-resist, i.e, by spin coating the metallo-organic solution onto a selected substrate material. The soft metallo-organic film is then heated in air or oxygen to decompose the organic components, such that a thin film is formed from the remaining metal oxides. Subsequent heat treatment of the metal oxide film results in a superconductive film of material.

By utilizing non-vacuum processing techniques, the metallo-organic deposition method provides a practical means for film preparation of semiconductor materials. In addition, the ease in which compounds of a variety of elements can be made allows a wide range of multi-metal compounds to be prepared.

Superconducting thin films, comprising barium, copper, and a rare earth (RE) metal, were formed on single crystal strontium titanate substrates by the thermal decomposition of a solution of the neodecanoates of the barium, copper, and rare earth metal. The preferred rare earth metals include yttrium, ytterbium, and europium.

As an illustrative example, $Y_1Ba_2Cu_4O_z$ superconducting films are formed in the following manner. A solution preferentially combines about 1 gram of the combined metal neodecanoates to about 1 milliliter of solvent, e.g., about 100 grams of the metal neodecanoates (about 13.5 grams of the yttrium neodecanoate, about 40.0 grams of the barium neodecanoate, and about 46.5 grams of the copper neodecanoate) were combined with about 100 milliliters of solvent (about five to twenty-five volume percent pyridine in xylene). The strontium titanate substrate was flooded with a solution of the preferred composition, and then spun dry at about 2000 revolutions per minute for about 30 seconds. The substrates were then rapidly placed in an air oven, which was preheated to about 500° C., for about five minutes so as to pyrolize the metallo-organics to their oxides. During this pyrolysis step, the metal neodecanoates are decomposed such that only a film comprising the desired metal oxide constituents remains on the substrate surface.

The metal oxide film was subsequently rapid thermal annealed in flowing oxygen in a two-step process. The films were annealed at about 850° C. for about 60 seconds, then immediately cooled to room temperature. A second rapid annealing was performed at about 920° C. for about 30 seconds followed by a rapid cooling to room temperature. Rapid thermal annealing of the films after pyrolysis resulted in superconductive films characterized by sharp transitions to full superconductivity.

Rutherford Backscattering Spectrometry was used to determine that the resulting film's empirical composition prepared in accordance with this method was approximately $Y_1Ba_2Cu_4O_z$. It is believed that z ranges between about 6 to about 8, as this is the ratio of the metals which corresponds to superconducting properties. This method of preparation may be employed to produce superconducting films of the rare earth (RE) metals having a general empirical composition of approximately $RE_1Ba_2Cu_4O_z$, wherein the rare earth metal is chosen from the group consisting of yttrium, ytterbium, europium, or a yttrium/europium combination.

Electrical measurements show a zero state resistance temperature of about 86K for a Y—Ba—Cu superconducting film prepared in accordance with this method and a superconducting transition temperature of about 90K. A superconducting film prepared in accordance with this method, comprising ytterbium and having an approximate empirical composition $Yb_1Ba_2Cu_4O_z$, is also characterized by a zero state resistance temperature of about 86K and a superconducting transition temperature of about 90K. A superconducting film prepared in accordance with this method, comprising europium and having an approximate empirical composition $Eu_1Ba_2Cu_4O_z$, exhibited a zero state resistance temperature of about 20K and a superconducting transition temperature of about 70K.

Suitable superconducting results have also been obtained by conventionally annealing the metal oxide thin films after pyrolysis of the metal neodecanoates. In accordance with this method the thin films are annealed in an oxygen containing environment for long durations, i.e., about six hours, at about 850° C., and slowly cooled to room temperature. The superconducting films prepared in accordance with this method are characterized by broad transitions to full superconductivity. Therefore although this method of annealing form suitable superconducting films, it is a lesser preferred method. For example, a superconducting film of $Y_1Ba_2Cu_4O_z$, prepared in accordance with this lesser preferred method, is characterized by a superconducting transition temperature of about 90K, with about 27K found to be the temperature of zero state resistance.

We are the first to employ non-vacuum techniques and produce thin film superconductors.

Other objects and advantages of this invention will be better appreciated from a detailed description thereof which follows.

DETAILED DESCRIPTION OF THE INVENTION

We are the first to achieve thin film superconductors using an entirely non-vacuum method. Metallo-organic deposition techniques are utilized to prepare the thin films of superconductive materials. Metallo-organic deposition is a highly reproducible method of thin film deposition which does not require a vacuum, produces films of uniform composition and thickness, and permits a simple but very controlled method for altering the chemical constituents of the films. Using rapid thermal annealing techniques the films prepared in accordance with these metallo-organic deposition techniques are characterized by sharp transitions to full superconductivity.

In the present invention, metallo-organic solutions are prepared using carboxylates of a rare earth (RE) metal, barium, and copper. The preferred carboxylates for forming the metallo-organic solutions are the neodecanoates of the various metals. We have found that the neodecanoates tend to be more soluble in the xylene/pyridine solution than other carboxylates, such as the 2-ethyl-hexanoates, and therefore result in superior films. The preferred rare earth metals are yttrium, ytterbium, europium, erbium and neodymium. Rutherford Backscattering Spectrometry analysis was used to determine film composition and thickness. Using this technique, the composition of the metallo-organic solutions may be adjusted to obtain the desired superconducting compositions.

The Rutherford Backscattering Spectrometry analysis revealed that the relative metal compositions of the preferred thin films were approximately $RE_1Ba_2Cu_4O_z$, and the rare earth (RE) metal comprising yttrium, ytterbium, europium, a ytterbium/europium combination, erbium or neodymium. Using Rutherford Backscattering Spectrometry, the relative compositions for the ytterbium comprising films and the europium comprising films were not determined precisely, because the relatively heavy atomic weight of ytterbium and europium prevented the accurate detection of these metals since the heavy metals were not entirely distinguishable from the barium in the composition. In addition, the concentration of oxygen in the thin films could not be determined precisely from the Rutherford Backscattering Spectrometry spectrum because the oxygen signal from the thin film coatings overlapped with that of the substrate on which the thin film coatings were formed.

The usual solvent for the metal neodecanoates is xylene, however it was observed that the yttrium, ytterbium, and europium neodecanoates gel in xylene forming an unusable ink. It was found that the addition of approximately about 5 to about 25 percent pyridine by volume to the xylene forms a solvent that will not gel these neodecanoates, although as low as about 1 percent pyridine should produce suitable films. However, far superior films are obtained with the increased amounts of pyridine.

It is to be noted that although the pyridine is necessary since without the pyridine the rare earth metal neodecanoate gels in xylene, it is desirable to minimize the amount of pyridine. Xylene promotes good film formation with its excellent surface wetting characteristics, therefore it is desirable to maximize the amount of xylene. It was found that the addition of five volume percent pyridine in the xylene broke the gel, yet did not totally dissolve the rare earth metal. In a solution having about 18 percent pyridine in xylene, the yttria is almost totally dissolved, however evidence of the gel material still remains. In a 23 volume percent pyridine in xylene solution, the yttria is completely dissolved, resulting in a superb metallo-organic solution. The resulting thin films produced with this solution are superb in quality. Therefore the optimal range appears to be about 20 to 25 volume percent pyridine in the xylene.

It also appears to be necessary for producing high quality films that the neodecanoates remain in solution for many hours. Typically the neodecanoates are dissolved into solution and stirred continuously for a length of time. It was found that the metallo-organic solution which was stirred for only 16 hours produced lesser quality films, while the metallo-organic solution which was stirred continuously for 60 hours produced films of extraordinary quality, exhibiting no evidence of surface defects over large areas of the substrate. Therefore, it is preferable that the solution be stirred for a length of time sufficient to intimately mix the constituents of the metallo-organic solution.

An alternative method for forming the metallo-organic solutions comprises adding the pyridine in two steps with a period of time between each addition for continuous stirring. First, the barium, copper, and rare earth neodecanoates are dissolved by stirring the neodecanoates in a 90 to 95 volume percent xylene and 5 to 10 volume percent pyridine solvent for approximately ten hours at room temperature. An additional amount of pyridine, up to about 25 volume percent total, is subsequently added to the metallo-organic solution after the first stirring step and the solution is further stirred for approximately one hour. There does not appear to be any benefits realized with this two step method, although suitable results were obtained. By forming a solution of the metal neodecanoates, the elements which will ultimately form the superconducting compound, are most intimately mixed.

The prepared metallo-organic solutions are subsequently spun on smooth strontium titanate substrates and then pyrolized to decompose the neodecanoates within the metallo-organic solution. Prior to pyrolysis, the metallo-organic solution is carefully poured onto the top surface of a stationary strontium titanate substrate, so as to flood the surface of the substrate. The strontium titanate substrates are about one centimeter square by about 0.15 centimeter height, oriented in the <100> crystal direction. The viscous metallo-organic solutions are spun onto the substrate surface at various speeds. Any excess solution is spun-off the substrate during spinning.

The following film thicknesses correspond to a viscosity of approximately 14 centi-poise for the metallo-organic solution. At 20 seconds at about 2000 revolutions per minute (RPM), the thickness of the metallo-organic film, after drying at about 85° C. so as to evaporate any solvent, will be about 4.4 micrometers, and the thickness of the metal oxide film after heating to about 500° C. so as to decompose the neodecanoates will be about 2600 Angstroms. For 20 seconds at 3000 RPM the thickness after drying at 85° C. will be about 3.7 micrometers and the thickness after heating at about 500° C. will be about 2100 Angstroms. At about 20 seconds at 4000 RPM the corresponding thicknesses after drying at 85° C. and heating at 500° C. are about 3.1 micrometers and 2090 Angstroms. At about 20 seconds at 7000 RPM the corresponding thicknesses after drying at 85° C. and heating at 500° C. are about 2.6 micrometers and 1700 Angstroms. These measurements were made using a step profile.

The method used during the pyrolysis of the metallo-organic solutions is significant, in that thermogravimetric analysis shows that the metal neodecanoates of the rare earth metal, the copper, and the barium volatilize and decompose at different temperatures. It was determined that the freshly prepared metallo-organic solutions, which have been spun onto the substrates, should be rapidly placed in a furnace preheated to about 500° C. It is preferred that the prepared solutions do not set at ambient conditions for too long a duration, although suitable results have been obtained when the films have remained at room temperature for a duration, or even dried at an elevated temperature such as 100° C., prior to the pyrolysis.

Using thermogravimetric analysis, it has been determined that the neodecanoates of the metals decompose at different temperatures. By placing the spun-on metallo-organic solutions rapidly into the oven preheated to a temperature greater than the decomposition temperature of each of the neodecanoates, the metal neodecanoates decompose simultaneously and instantaneously. This ensures uniform decomposition and results in a higher quality film. Also, it is believed that the barium neodecanoate decomposes in two steps, therefore this manner of pyrolysis is desirable to ensure uniform and homogenous decomposition of each of the metallo-organics. This method results in high quality thin films of the metal oxides which ultimately become the superconducting composition.

After the pyrolysis step an oxide film of the appropriate metal oxide composition remains on the substrate. The proportion of the metals within the oxide composition remaining on the substrate surface does not necessarily correspond to the proportions of the metals initially in the metallo-organic solution. This is due to the differences in volatilities and decomposition rates for the various metal neodecanoates. However, the proportion of the metals within the oxide composition remaining on the substrate after pyrolysis does correspond reliably to the final composition of the superconducting film after annealing. Using this method for film preparation, the composition of the metallo-organic solutions may be adjusted to obtain various compositions in the oxide films.

This two step sequence of first spinning the metallo-organic solution onto the substrate followed immediately by pyrolysis at a temperature sufficient to decompose the metal neodecanoates, may be repeated a sufficient amount of times, so as to produce films having a thickness of up to about 2.0 micrometers. Suitable results should also be obtained with film thicknesses as low as about 0.1 micrometers. These films may be processed, by employing multiple deposition techniques in accordance with this invention, to result in thicker or thinner films for optimal superconducting characteristics.

After repeating the spinning and pyrolysis sequence sufficiently so as to achieve the desired metal oxide thickness on the substrate, the films are then annealed in a non-vacuum oxygen containing environment at atmospheric pressure and a sufficient temperature for a sufficient duration to promote recrystallization and grain growth within the metal oxides. The resulting films are characterized by superconductive electrical properties.

It is preferred that the metal oxide films be rapid thermal annealed, i.e., exposed to the annealing temperature for a relatively short duration, from an instantaneous amount of time up to about 2 minutes. It is also preferred that the rapid thermal annealing be accomplished in two steps: first, a lower temperature exposure which presumably creates small nucleation sites at the substrate/film interface and a second higher temperature exposure to promote rapid grain growth at those nucleation sites. The first exposure at the lower temperature appears to be beneficial since it creates the nucleation sites, yet reduces the amount of diffusion interaction between the substrate and film.

It has been determined that the use of rapid thermal annealing techniques produce superconducting films characterized by higher zero state resistance temperatures and sharp transitions to full superconductivity. This is contrast to the broad transitions to full superconductivity for the films which are conventionally annealed by baking at the desired temperature for a longer duration, i.e., about 6 hours.

Rapid thermal annealing techniques raise the temperature of the substrate and deposited film uniformly and almost instantaneously to the desired annealing temperature. Two methods are generally employed for rapid thermal annealing. The first method, which is the method we prefer, comprises heating the material using quartz lamps. The quartz lamps generate extremely large dosages of infrared electromagnetic radiation in the form of light. The substrates and films are heated very rapidly by exposing the substrates to the quartz lamps and electromagnetic radiation. The second method involves placing the substrates and films on a graphite receptacle and exposing the substrates to microwaves. The microwaves impinge the films deposited on the surface of the substrate and heat the film and substrate uniformly and quickly.

We are the first to produce superconducting thin films using entirely non-vacuum techniques.

Y1—Ba—Cu Films

Superconducting films of the approximate empirical composition $YBa_2Cu_4O_z$, were produced using this method. A metallo-organic solution was prepared using the neodecanoates of yttrium, barium, and copper. Metallo-organics of the yttrium and the barium neodecanoates were formed from their metal acetates by reaction with ammonium neodecanoate. The copper metallo-organic was formed by a reaction of copper (II) acetate with tetramethyl ammonium neodecanoate. The usual solvent for the metal neodecanoates is xylene, however we observed that the yttrium neodecanoate gels in xylene, forming an unusable ink. The addition of approximately 20 to 25 volume percent pyridine to the xylene forms a solvent that will not gel the yttrium neodecanoate, and results in thin films of superb quality. The metal-neodecanoate solution is optimally stirred for a long period of time, although this is not necessary, so as to ensure complete and intimate mixing of the solution constituents. Several solutions containing the yttrium, barium, and copper neodecanoates, of various concentrations, were made by dissolving the three components in appropriate amounts of xylene and pyridine.

The metallo-organic solution which resulted in the superconductor film composition of $YBa_2Cu_4O_z$, has a ratio of one gram of the combined metal neodecanoates to one milliliter of solvent. About 13.5 grams of yttrium neodecanoate, about 40.0 grams of barium neodecanoate, and about 46.5 grams of copper neodecanoate, yielding a total of about 100 grams of metal neodecanoate, were dissolved in about 100 milliliters of solvent, the solvent comprising about 20 to 25 milliliters of pyridine preferably in a balance of xylene. The metallo-organic solution was continuously stirred, preferably for approximately 60 hours, at room temperature. This method results in superior metallo-organic solutions for purposes of forming high-quality superconducting films. However, suitable results have been obtained when the solvent contains less pyridine or has been stirred for a shorter duration of time.

The metal neodecanoates when dissolved in the solvents, yield a green colored liquid having an approximate viscosity of approximately 14 centipoise, although the viscosity may range between about 5 and 15 centipoise with no detrimental effects. If the solutions become too viscous, they will not coat the substrate uniformly during the spinning step. If the solutions are not viscous enough they may run off the substrate and again form poor quality films. The solutions were filtered, using teflon membranes, to remove particles down to approximately 200 nanometers in size.

The metallo-organic solutions prepared from the yttrium, barium, and copper neodecanoates and solvents were flooded onto stationary single crystal strontium titanate, $SrTiO_3$, substrates of about one centimeter width by about one centimeter length by about 0.15 centimeter height, oriented in the $<100>$ crystal direction. The metallo-organic solutions were spun dry on the substrates at various speeds, about 2000 revolutions per minute for about 20 seconds being preferred. The spun-on solutions were immediately placed in an furnace preheated to about 500° C. The spun-on solutions were heated in air at that temperature, 500° C., for about 5 minutes to decompose the yttrium, barium, and copper neodecanoates. This two step, spin-on and fire, deposition sequence was typically repeated multiple times to build the thickness of the films up to preferably about 2.0 microns, however multiple depositions are not required. X-ray diffraction analysis of the films pyrolized at 500° C. showed the presence of only microcrystallites. Room temperature resistivites of $1 \times 10^2$ ohms-centimeter were measured for these films; i.e., no superconducting behavior was observed for these films after pyrolysis.

The method in which the dried metallo-organic solutions are fired on the substrates is important because thermogravimetric analysis shows that the metal neodecanoates volatalize and decompose at different temperatures. Complete decomposition of the combined yttrium, barium, and copper neodecanoates used in this invention occurs at about 450° C., leaving only the yttrium, barium, and copper oxides on the substrate in an amount proportional to the original metallo-organic solutions. We found that if the dried solutions on the substrates are immediately placed in a furnace set at about 500° C., quality thin films of the superconducting composition are made. After pyrolysis, the thin films are characterized by very fine crystallites distributed uniformly throughout the film.

After forming the desired thickness of the film and the subsequent pyrolysis required to decompose the organic neodecanoates and leave only the metal oxides on the substrate, the samples were annealed in a non-vacuum, oxygen containing environment to promote recrystallization and grain growth within the material. Preferably, the films were rapid thermal annealed in two steps at approximately 850° C. and approximately 920° C. in an oxygen-containing atmosphere for an instantaneous amount of time up to about 2 minutes and rapidly quenched to room temperature after each exposure at temperature. The resulting films of approximate empirical formula $YBa_2Cu_4O_z$, as determined by Rutherford Backscattering Spectrometry, exhibit superconductive characteristics.

Many Y—Ba—Cu samples were prepared in accordance with this metallo-organic deposition and pyrolysis method, and then rapid thermal annealed in flowing oxygen. The strontium substrates having the Y—Ba—Cu films were placed upon oxidized silicon wafers, rapidly heated to about 850° C. for about 60 seconds using infrared radiation produced by a bank of quartz lamps then allowed to cool to room temperature. A second rapid annealing was then performed at 920° C. for about 30 seconds.

Thin film superconductors formed in this manner were very uniform in structure and thickness across the surface of the film. Unlike films formed from metallo-organic deposition of the two-ethyl hexanoates or sol-gels, the films formed from the neodecanoates were quite homogenous with no cracking or large voids. The average grain size within the film after rapid thermal annealing was found to be approximately 1 micron wide and approximately 2 microns long. This is a factor of about 4 times larger than the grains size of conventional furnace annealed films formed by this metallo-organic deposition method.

A large grain size is an important factor in obtaining high temperature superconducting films with an abrupt transition to zero resistance. The grain size of the superconducting phase $YBa_2Cu_3O_z$, the 1:2:3 phase, increases as the temperature increases up to the melting point of the materials, about 935° C. Therefore, the second annealing temperature of 920° C. is beneficial for promoting grain growth within the films.

Rutherford Backscattering Analysis, using 3.6 MeV $4He^+$ ions, showed that films formed from the combined neodecanoates had the compositions $YBa_{2.25}Cu_{4.19}O_z$ where z is undetermined. By dissolving the films in nitric acid it was also possible to analyze their chemical composition using Inductively Coupled Plasma Emission Spectroscopy (ICPES). From the ICPES analysis it was determined that the Y-based films had the composition $YBa_{2.18}Cu_{4.10}O$. The two distinct methods of chemical analysis show excellent agreement for the Y-based films.

Four-probe resistance versus temperature measurements were determined for the films of Y—Ba—Cu which had been processed by rapid thermal annealing in two-steps. A superconducting transition temperature was observed at about 90K with zero resistance at 86K. The critical current density of the rapid thermal annealed films is approximately 200 Amperes per square centimeter at 77K. Room temperature resistivities of the rapid thermal annealed samples were about $3 \times 10^{-3}$ ohms-centimeters.

X-ray diffraction was performed on the Y—Ba—Cu films prepared in accordance with the metallo-organic deposition and rapid thermal annealing methods disclosed here. Analysis of the diffraction pattern showed that the $YBa_2Cu_3O_z$ (1:2:3 phase) was the major phase and has an orthorhombic crystal structure. Strong peaks due to the (00 ) diffraction planes of the 1:2:3 phase indicate preferential orientation of the 1:2:3 grains with their c-axis perpendicular to the $<100>$ $SrTiO_3$ surface. There are also other very strong peaks due to the (h00) diffraction planes which indicates that some of the 1:2:3 grains are preferentially oriented with their a-axis perpendicular to the $<100>$ $SrTiO_3$ surface, implying preferential 1:2:3 grain orientation with the c-axis parallel to the substrate surface. The x-ray measurements performed do not permit a quantitative determination of the percentage of grains oriented in either of the two directions. The two major orientations may be due to the presence of a bilayer structure which results in some rapid thermal annealed films.

In addition to the pronounced 1:2:3 peaks indicating a preferentially oriented film structure, there are other peaks due to the minor phases of $BaCuO_2$, $Y_2BaCuO_5$ and the gamma phase ($Y_zBa_4Cu_8O_2$). Unlike the specimens conventionally furnace annealed at 850° C., a reduced amount of $YBaSrCu_3O_x$ was observed, which indicates the rapid thermal annealing may reduce the interaction between the substrate and the metal oxide film.

Ion channeling analysis using 2 MeV $4He^+$ was also performed on the Y—Ba—Cu film and indicated that there was some epitaxial growth of the film on the $<100>$ $SrTiO_3$ substrate, which confirmed the results of the X-ray diffraction analysis. From the combined x-ray and channeling work, it was observed that the 1:2:3 phase was the major phase in the films and that the grains were preferentially oriented with respect to the $<100>$ $SrTiO_3$ surface.

It is believed that the preferred orientation may arise because the first anneal at 850° C. initiates grain growth at nucleation sites at the $SrTiO_3$ surface. The second anneal at 920° C., which is only slightly below the temperature, 935° C., where the high transition temperature Y—Ba—Cu materials melt incongruently, may result in grain growth from the grains formed on the substrate during the first anneal. It appears that the high superconducting onset and zero resistance temperatures of the rapid thermal annealed materials may be the result of the combined effects of enhanced grain growth and reduced strontium diffusion into the superconducting films.

For a $YBa_2Cu_4O_z$ film, rapid thermal annealed in a single step, at approximately 920° C. for about 1 minute and subsequently quenched in air to room temperature, a zero point resistance temperature of about 70K was measured, wherein the upper limit for the resistivity was set at $7.6 \times 10^{-8}$ ohms per centimeter. This material is also characterized by a superconducting transition temperature of about 90K, wherein a rapid drop in resistance was observed. At room temperature the resistivity was approximately $2.7 \times 10^{-3}$ ohms per centimeter. Silver paint was used to make the four probe resistance measurements in order to determine the superconducting characteristics.

It is preferred that the material be annealed at a temperature ranging between about 850° C. to about 1000° C. and for a duration of about an instantaneous amount of time up to about 2 minutes, with about 15 seconds to one minute being more preferred. The duration and annealing temperature are inversely related; i.e, a shorter duration is required at a higher temperature.

Although the rapid thermal annealing technique is preferred, superconducting thin films of $Y_1Ba_2Cu_4O_z$, with z ranging between about 6-8, were also prepared by annealing at 850° C. for 6 hours, rather than rapid thermal annealing. These samples were then slow cooled to room temperature, at a rate of about 100° C. per hour. Resistance versus temperature measurements, for these superconducting thin films were determined. Silver paint was used to make four probe resistance measurements. At room temperature the resistivity was approximately $2.7 \times 10^{-3}$ ohms per centimeter. A rapid drop in resistance was observed around 90K with zero resistance achieved at 37K. An upper limit for the resistivity at 37K was set at $7.6 \times 10^{-8}$ ohms per centimeter, representing a decrease from the room temperature resistivity by a factor of 36,000.

Superconducting thin films of $YBa_{3.3}Cu_{5.7}O_z$ were also formed on strontium titanate substrates oriented in the $<112>$ crystal direction by metallo-organic deposition techniques in accordance with this invention, and subsequent annealing at about 850° C. for about 6 hours followed by a slow cool to room temperature at about a rate of 100° C. per hour. Silver paint was used to make four probe resistance measurements and a superconducting transition temperature of about 80K was observed with about 27K found to be the temperature of zero state resistance for this material.

Superconducting thin films of $YBa_2Cu_3O_z$ were also formed in accordance with this invention on strontium titanate substrates oriented in the $<112>$ direction. However, a significantly lower superconducting transition temperature for the $YBa_2Cu_3O_z$ films, about 17K, was observed. Scanning electron micrographs show that the average grain size of the $YBa_2Cu_3O_z$ films is about half as large, about 125 nanometers, as those of the $YBa_2Cu_4O_z$ or $YBa_{3.3}Cu_{5.7}O_z$ films. This substantial difference in grain size may account for the difference in values of superconducting transition temperatures. It is believed that rapid thermal annealing techniques would enhance the superconducting properties of these materials.

Yb—Ba—Cu Films

Superconducting films comprising the rare earth metal, ytterbium, and having an empirical composition of $Yb_1Ba_2Cu_4O_z$, were produced using this metallo-organic deposition method. A metallo-organic solution was prepared using the neodecanoates of ytterbium, barium, and copper. Metallo-organics of the ytterbium and the barium neodecanoates were formed from their metal acetates by reaction with ammonium neodecanoate. The copper metallo-organic was formed by a reaction of copper (II) acetate with tetramethyl ammonium neodecanoate. The metal neodecanoates were prepared in the same manner as the yttrium based materials. Solutions containing the ytterbium, barium, and copper neodecanoates, of various concentrations, may be made by dissolving the three components in appropriate amounts of xylene and pyridine.

The ytterbium comprising solution which resulted in the superconductor film composition of $Yb_1Ba_2Cu_4O_z$, has a ratio of one gram of the combined metal neodecanoates to one milliliter of solvent. Approximately 15.5 grams of the ytterbium neodecanoate, 39.0 grams of the barium neodecanoate, and 45.5 grams of the copper neodecanoate, yielding a total of about 100 grams of metal neodecanoate, were dissolved in about 100 milliliters of solvent, the solvent comprising about 80 milliliters of xylene with about 20 milliliters of pyridine.

The metallo-organic solution was sufficiently stirred so as to ensures intimate mixing of the elements. The solutions are viscous and were filtered, using teflon membranes, to remove particles down to approximately 200 nanometers in size.

The metallo-organic solutions prepared from the ytterbium, barium, and copper neodecanoates and solvents were flooded onto stationary single crystal strontium titanate, $SrTiO_3$, substrates of about one centimeter width by about one centimeter length by about 0.15 centimeter height, oriented in the <100> crystal direction. The solutions were spun dry on the substrates at various speeds, about 2000 revolutions per minute for about 20 seconds, being preferred. The spun-on solutions were immediately placed in a furnace preheated to about 500° C. The thin film solutions were heated in air at that temperature, 500° C., for about 5 minutes to decompose the ytterbium, barium, and copper neodecanoates leaving the metal oxides on the substrate surface in an amount proportional to the amount within the original metallo-organic solutions. This two step, spin-on and fire, deposition sequence was typically repeated multiple times to obtain a desired thickness between about 1.5 and 2.0 microns, however multiple depositions are not required.

Thermogravimetric analysis shows that the metal neodecanoates volatalize and decompose at different temperatures. Complete decomposition of the combined ytterbium, barium, and copper neodecanoates used in this invention occurs at about 450° C., leaving only the ytterbium, barium, and copper oxides remaining on the strontium titanate substrate. The inventors found that if the dried solutions on the substrates are immediately placed in a furnace set at about 500° C., quality thin films of the superconducting composition are made. After pyrolysis, the thin films are characterized by uniformly distributed fine crystallites.

After obtaining the desired thickness of the film and completing the subsequent firing required to decompose the metal neodecanoates and leave only the metal oxides remaining on the substrate, the samples were annealed in a non-vacuum, pure oxygen environment to promote recrystallization and grain growth within the material. Preferably, the films were rapid thermal annealed in two steps at about 850° C. and cooled, then at about 920° C. in an oxygen-containing atmosphere for an instantaneous amount of time up to about 2 minutes and rapidly quenched to room temperature. The resulting films of $Yb_1Ba_2Cu_4O_z$, prepared in accordance with this method exhibit superconductive characteristics.

A ytterbium comprising film having the approximate empirical composition $Yb_1Ba_2Cu_4O_z$, as determined by Rutherford Backscattering Spectrometry, was prepared in accordance with the above described metallo-organic deposition method and rapid thermal annealed in oxygen at atmospheric pressure, first at a temperature of about 850° C. for about 60 seconds and subsequently at a second temperature of about 920° C. for about 30 seconds. After rapid thermal annealing, the samples are quenched in flowing oxygen to room temperature. The oxygen is flowed at a rate of approximately 4.9 liters/minute.

Silver paint was used to make four probe resistance measurements and a zero point resistance temperature of about 84K was measured. Zero point resistance was defined as that temperature which corresponds to the upper limit for resistivity set at $7.6 \times 10^{-8}$ ohms per centimeter. This material is further characterized by a superconducting transition temperature of at least about 90K. At room temperature the resistivity was approximately $1.2 \times 10^{-3}$ ohms per centimeter. X-ray analysis revealed that the superconducting grains within the films were partially epitaxial; a significant portion of the grains having the c-axis perpendicular to the <100> strontium titanate substrate, an orientation which enhances the current carrying capacity of the films and a significant amount of the remaining portion of the grains having the c-axis parallel to the <100> strontium titanate substrate.

It is believed that this two-step rapid thermal annealing process may be beneficial in that the first lower temperature exposure may promote nucleation within the material at the substrate-film interface, while the second higher temperature exposure facilitates rapid grain growth, by promoting incongruent melting, within the composition. It is generally known that the presence of the liquid phase greatly enhances grain growth within ceramic materials.

However, a single rapid thermal annealing step at 920° C. for an instantaneous amount of time up to about 2 minutes is believed to be sufficient to produce superconducting films. It is preferred that the material be annealed at a temperature ranging between about 850° C. to about 1000° C. and for a duration of about an instantaneous amount of time up to about 2 minutes, with about 15 seconds to one minute being especially preferred. The duration and annealing temperature are inversely related; i.e, a shorter duration is required at a higher temperature. In addition, suitable results should be obtained using more conventional annealing techniques such as annealing at about 850° C. to about 1000° C. for a sufficient time to promote recrystallization and grain growth.

Eu—Ba—Cu Films

Superconducting films comprising the rare earth metal, europium, and having an empirical composition of approximately $Eu_1Ba_2Cu_4O_z$, were also produced using this metallo-organic deposition method. A metallo-organic solution was prepared using the neodecanoates of europium, barium, and copper. Metallo-organics of the europium and the barium neodecanoates were formed from their metal acetates by reaction with ammonium neodecanoate. The copper metallo-organic was formed by a reaction of copper (II) acetate with tetramethyl ammonium neodecanoate. The metallo-organic solutions were prepared in accordance with the methods described above for the Y—Ba—Cu and Yb—Ba—Cu films. With this method, the solutions containing the europium, barium, and copper neodecanoates, of various concentrations, may be made by dissolving the three components in appropriate amounts of xylene and pyridine.

The europium comprising solution which resulted in the superconductor film composition of approximately $Eu_1Ba_2Cu_4O_z$, has a ratio of about one gram of the combined metal neodecanoates to about one milliliter of solvent. Approximately 15.5 grams of the europium neodecanoate, 38.6 grams of the barium neodecanoate, and 45.9 grams of the copper neodecanoate, yielding a total of about 100 grams of metal neodecanoate, were dissolved in about 100 milliliters of solvent, the solvent comprising about 80 milliliters of xylene with about 20 milliliters of pyridine. The solution was stirred sufficiently so as to achieve homogenity within the metallo-organic solution. The solutions were filtered, using teflon membranes, to remove particles down to approximately 200 nanometers in size.

The metallo-organic solutions prepared from the europium, barium, and copper neodecanoates and solvents were flooded onto stationary single crystal strontium titanate, $SrTiO_3$, substrates of about one centimeter width by about one centimeter length by about 0.15 centimeter height, oriented in the <100> crystal direction. The solutions were spun dry on the substrates at various speeds, about 2000 revolutions per minute for about 20 seconds, being preferred, and resulting in a film thickness of about 2600 Angstroms. The spun-on solutions were immediately placed in a furnace preheated to about 500° C. The thin film solution were heated in air at that temperature, 500° C., for about 5 minutes to decompose the europium, barium, and copper neodecanoates. This two step, spin-on and pyrolysis, deposition sequence was typically repeated multiple times to obtain a desired thickness between about 1.5 and 2.0 microns, however multiple depositions are not required.

Thermogravimetric analysis shows that complete decomposition of the combined europium, barium, and copper neodecanoates used in this invention occurs at about 450° C., leaving only the europium, barium, and copper oxides remaining on the strontium titanate substrate in amounts corresponding to the original amounts within the metallo-organic solution. The inventors found that if the dried solutions on the substrates are immediately placed in a furnace set at about 500° C., quality thin films of the superconducting composition are made for purposes of preparing superconducting films.

After obtaining the desired thickness of the solution and completing the subsequent firing required to decompose the metal neodecanoates and leave only the metal oxides remaining on the substrate, the europium comprising samples were annealed in a non-vacuum, oxygen containing environment at atmospheric pressure to promote recrystallization and grain growth within the material. Preferably, the films were rapid thermal annealed using quartz lamps at about 930° C. in an oxygen-containing atmosphere for an instantaneous amount of time up to about 2 minutes and rapidly quenched to room temperature. The resulting films of $Eu_1Ba_2Cu_4O_z$, prepared in accordance with this method exhibit superconductive characteristics.

For a $Eu_1Ba_2Cu_4O_z$ sample prepared in accordance with this metallo-organic deposition method and rapid thermal annealed in oxygen at a temperature of about 930° C. for about 45 seconds and quenched in oxygen flowed at a rate of about 4.9 liters per minute to room temperature, a zero point resistance temperature of about 20K was measured, where zero point resistance was defined as the temperature corresponding to $7.6 \times 10^{-8}$ ohms per centimeter. This material is further characterized by a superconducting transition temperature of about 70K, wherein a rapid drop in resistivity occurred. The room temperature resistivity was approximately $2.7 \times 10^{-3}$ ohms per centimeter. Silver paint was used to make the four probe resistance measurements.

It is believed that the empirical composition for the superconducting europium comprising films is approximately $Eu_1Ba_2Cu_4O_z$. Rutherford Backscattering Analysis was employed to determine the empirical composition, however due to the weight of the europium, it was difficult to distinguish the europium from the barium during the analysis. This also occurred during the analysis of the ytterbium comprising superconducting material. It is believed that the superconducting characteristics of the europium comprising film may be optimized upon better analysis of the material.

It is preferred that the material be annealed at a temperature ranging between about 850° C. to about 1000° C. and for a duration of about an instantaneous amount of time up to about 2 minutes, with about 15 seconds to one minute being especially preferred. The duration and annealing temperature are inversely related; i.e, a shorter duration is required at a higher temperature. In addition, suitable results should be obtained using more conventional annealing techniques such as annealing at about 850° C. to about 1000° C. for a sufficient time to promote recrystallization and grain growth.

Eu—Yb—Ba—Cu Films

It is further believed that superconducting films comprising both europium and ytterbium having an empirical composition of $Eu_{0.5}Yb_{0.5}Ba_2Cu_4O_z$, may also be produced in accordance with this method for metallo-organic deposition and rapid thermal annealing. A metallo-organic solution comprising the appropriate amounts of the metal neodecanoates of europium, ytterbium, barium, and copper dissolved in the appropriate amounts of pyridine in xylene, would be spun-on to the appropriate substrate and fired at a temperature so as to decompose the organic neodecanotes. The substrate and film would then be annealed, preferably using rapid thermal annealing techniques, at the appropriate temperature to promote grain growth and recrystallization.

Er—Ba—Cu Films

Superconducting films comprising the rare earth metal, erbium, and having an empirical composition of approximately $Er_1Ba_2Cu_4O_z$, were also produced using this metallo-organic deposition method, as described above for the Y13 Ba—Cu, Yb—Ba—Cu and Eu—Ba—Cu films. The erbium comprising solution which resulted in the superconductor film composition of approximately $Er_1Ba_2Cu_4O_z$, has a ratio of approximately one gram of the combined metal neodecanoates to about one milliliter of solvent. Approximately 18.8 grams of the erbium neodecanoate, 37.6 grams of the barium neodecanoate, and 43.6 grams of the copper neodecanoate, yielding a total of about 100 grams of metal neodecanoate, were dissolved in about 100 milliliters of solvent, the solvent comprising about 80 milliliters of xylene with about 20 milliliters of pyridine. The solution was stirred sufficiently so as to achieve homogeny within the metallo-organic solution. The solutions were filtered, using Teflon membranes, to remove particles down to approximately 200 nanometers in size.

The erbium comprising metallo-organic solution was then flooded onto a stationary single crystal strontium titanate substrate oriented in the <100> crystal direction, and spun dry at about 2000 revolutions per minute for about 20 seconds. This resulted in a film thickness of about 2600 Angstroms. The spun-on films were then rapidly placed in a furnace preheated to about 500° C. for about five minutes to ensure complete and uniform decomposition of the neodecanoates. Thicker films may be produced by repeating the spinning and pyrolysis steps.

The erbium comprising films were then rapid thermal annealed at about 930° C. in an oxygen-containing environment for about 2 minutes and rapidly quenched in flowing oxygen to room temperature. The resultant film of $ErBa_2Cu_4O^z$ exhibited superconductive properties and was characterized by a zero resistance temperature of about 81K, where zero point resistance was defined as the temperature corresponding to $7.6 \times 10^{-8}$ ohms per centimeter.

Nd—Ba—Cu Films

It is believed that superconductive thin films of a neodymium-barium-copper oxide composition can be prepared using this metallo-organic deposition method. A thin film having the approximate composition of $Nd_1Ba_2Cu_4O_z$ was prepared in accordance with this invention and exhibited evidence of superconductivity. The metallo-organic solution was prepared having a ratio of about 1 gram of the metal neodecanoates to about 1 milliliter of solvent. About 100 grams of the metal neodecanoates; i.e., about 18.8 grams of the neodymium neodecanoate, about 37.6 grams of the barium neodecanoate and about 43.6 grams of the copper neodecanoate, was sufficiently mixed with about 100 milliliters of xylene. Some evidence of gelling within the solution was observed, therefore it may be desirable to add a small amount of pyridine to the solution.

The metallo-organic solution was then spun-on and pyrolyzed at about 500° C. in accordance with the deposition process described above with respect to the yttrium, ytterbium, europium, and erbium comprising films. The resultant metal oxide film was then rapid thermal annealed in an oxygen containing environment at a first temperature of about 850° C. for about 60 seconds and quenched to room temperature in flowing oxygen, and subsequently rapid thermal annealed at about 920° C. for about 30 seconds, followed by the quench in flowing oxygen. The resultant film showed evidence of superconductivity, but not full superconductivity. It is believed that rapid thermal annealing at a higher temperature, such as about 930° C. would result in an neodymium-barium-copper oxide film exhibiting full superconductive properties.

In addition, it is believed that superconducting films of lanthanum could also be produced in accordance with the method described above. The inventors are the first to achieve thin film superconductors using an entirely non-vacuum process. With this invention, superconducting thin films of various compositions comprising a rare earth metal have also been formed on barium titanate and sapphire substrates. Other suitable substrates which are temperature and diffusion resistant may be utilized. In addition, it is believed that the addition of more barium to the solutions may improve the thin films, since the excess barium may promote better epitaxial growth and a higher current density. It is also believed that superconducting thin films may be formed, in accordance with this invention, on silicon or silicon oxide substrates if a suitable barrier layer, such as a zirconia-based or strontium titanate layer, is provided between the substrate and metal neodecanoate solutions. In addition, it is believed that superconducting films may be formed, in accordance with this invention, on gallium arsenide substrates, if a suitable barrier layer(s), such as an appropriate oxide or nitride layer with or without a subsequent intervening layer of a noble metal like platinum or gold, is provided between the substrate and metal neodecanoate solution. Also, it is believed that these films may be formed on magnesium oxide, possibly even without a barrier layer.

This invention readily facilitates modification of the metal constituents and their ratios in the thin films, to obtain optimal superconducting characteristics within the thin films. This invention is also, an entirely non-vacuum process which is compatible with film processing techniques. While our invention has been described in terms of preferred embodiments it is apparent that other forms could be adopted by one skilled in the art without departing from the spirit of the invention, such as annealing the materials be exposing the materials to a focused laser beam. Accordingly the scope of our invention is to be limited only by the following claims.

The embodiments of the invention in which an exclusive property or privilege is claimed are defined as follows:

1. A method for producing thin film superconductor materials comprising the steps of:
   forming a solution from the neodecanoates of yttrium, barium, and copper metals, said metals form an oxide mixture exhibiting superconductive properties, said solution comprises a solvent having at least approximately 5 volume percent pyridine in xylene;
   depositing a film of said solution onto a substrate, said substrate selected from the group consisting of strontium titanate, barium titanate, and sapphire;
   pyrolyzing said film in an oxygen-containing environment at a first temperature of about 500° C. for about 5 minutes, so as to thermally decompose said neodecanoates of yttrium, barium, and copper into a film containing oxides of yttrium, barium, and copper, said pyrolyzing occurring substantially immediately after said depositing step; and
   heating said metal oxide film at a second temperature ranging between about 850° C. and 1000° C. and for a duration of up to approximately 2 minutes to promote recrystallization and grain growth of said metal oxides within said film and induce a change therein by which said film exhibits superconducting properties at a significantly increased temperature.

2. A method for producing thin film superconductor materials comprising the steps of:
   forming a solution from the neodecanoates of yttrium, barium, and copper metals, said metals form an oxide mixture exhibiting superconductive properties, said oxide mixture characterized by a ratio of approximately 1:2:4 for said yttrium, barium and copper metals respectively, said solution comprises a solvent having at least approximately 5 volume percent pyridine in xylene;
   depositing a film of said solution onto a substrate, said substrate selected from the group consisting of strontium titanate, barium titanate, and sapphire;
   pyrolyzing said film in an oxygen-containing environment at a first temperature of about 500° C. for about 5 minutes, so as to decompose said neodecanoates of yttrium, barium, and copper into a film containing oxides of yttrium, barium, and copper, said pyrolyzing occurring substantially immediately after said depositing step; and
   heating said metal oxide film to a second temperature of about 850° C. for a duration of approximately no more than 2 minutes and allowing said metal oxide film to cool to room temperature, then heating said metal oxide film to a third temperature of about 920° C. for a duration of approximately no more than 1 minutes so as to promote recrystallation and grain growth of said metal oxides within said film and induce a change therein by which said film exhibits superconducting properties at a significantly increased temperature.

* * * * *